United States Patent [19]

Faris

[11] 4,144,465

[45] Mar. 13, 1979

[54] SELF-RESETTING JOSEPHSON DEVICE CIRCUIT

[75] Inventor: Sadeg M. Faris, Yorktown Heights, N.Y.

[73] Assignee: International Business Machines Corporation, Armonk, N.Y.

[21] Appl. No.: 811,800

[22] Filed: Jun. 30, 1977

[51] Int. Cl.$^2$ .................. H03K 3/38; H03K 5/153
[52] U.S. Cl. .................................. 307/277; 307/261; 307/306
[58] Field of Search ............... 307/212, 245, 261, 266, 307/273, 277, 306

[56] References Cited

PUBLICATIONS

D. J. Herrell, "Josephson Multivibrator and Monostable Circuits," IBM Technical Disclosure Bulletin, vol. 17, No. 10, Mar. 1975, pp. 3082-3083.

*Primary Examiner*—John Zazworsky
*Attorney, Agent, or Firm*—Pollock, Vande Sande & Priddy

[57] ABSTRACT

A self-resetting Josephson device circuit is disclosed which responds to one transition of a circuit input by producing a short output pulse, and which resets itself in response to another, complementary transition of said circuit input. The Josephson device circuit includes a first and second Josephson device, one coupling a dc source to a current sink, said second connected in series with an inductor between said current source and sink. The circuit input, which is of a square waveform, is applied, in series, to first control circuits of the first and second Josephson devices. The second Josephson device has a second control circuit to which dc is applied of polarity opposite to the current in the first control circuit and of an amplitude substantially the same as the amplitude in the first control circuit when said circuit input is present. An output circuit includes a third Josephson device coupled in series with a second inductor and a resistor, with the series circuit coupled to said dc source. With the output circuit including the third Josephson device connected across the first Josephson device, an output pulse is produced across the second inductance and resistance on a high going transition of the circuit input. On the other hand, if the output circuit is connected across the second Josephson device then an output taken across the second inductor and resistance is produced in response to a low going transition of the circuit input. In either case, the circuit responds to the complementary transition by resetting itself.

16 Claims, 10 Drawing Figures

SELF-RESETTING JOSEPHSON DEVICE CIRCUIT

GOVERNMENT RIGHTS

The U.S. Government may practice, for Governmental purposes, the invention claimed herein without payment of any royalties thereon.

FIELD OF THE INVENTION

The present invention relates to circuits including Josephson devices, and more particularly, to a self-resetting Josephson circuit powered by direct current.

BACKGROUND OF THE INVENTION

The present invention makes use of devices capable of supporting Josephson tunnelling currents. The basic theoretical explanation of the Josephson effect is given in an article "Possible New Effects for Conductive Tunnelling" by B. B. Josephson, published in *Physics Letters*, July 1962, pages 251–53. Since then, numerous other publications have disclosed Josephson devices and proposed their application for a variety of functions. A particular advantage of circuits including Josephson devices is their rapid switching speed and their corresponding capabilities to produce pulses having widths in the pico-second range.

A Josephson device is essentially a bi-stable device, in that, in its superconducting or zero voltage state, the device will pass current up to some threshold and so long as the threshold is not exceeded, the device will remain in its zero voltage or superconducting state. The threshold is a function of device parameters as well as any magnetic field in which the device exists. For added purposes of control, Josephson devices are, in some cases, associated with one or more control conductors which, when a current is applied thereto, produce a magnetic field for reducing the maximum threshold current of the Josephson device.

One prior art device, a so-called SQUID, an acronym for superconducting quantum interference device, is simply a Josephson device having two or more control conductors which are arranged so that the switching device may be subjected to a magnetic field which is the net result of the magnetic field produced by the control conductors. When the device switches from its zero voltage or superconducting state to the voltage state, by reason of passing a current through the device which exceeds the threshold, the device will remain in the voltage state until such time as the current through the device is reduced to zero, at which time the device will switch back to the zero voltage state. Significantly, merely reducing the current through the device below the threshold will not switch the device back to a zero voltage state. Thus, the art, in employing Josephson devices, has found it necessary to provide some apparatus or method of operation to reset the Josephson device after it has assumed the voltage state, if it is desired that the device again regains the zero voltage state. Such action is necessary, if, for instance, cyclical operation is desired. In one arrangement, the device is reset by applying to it an alternating current, that is, a current having two different polarities. If the device normally conducts current of one sense, the device can be reset when the current applied to it is in the opposite sense. See, for example, "Clock and Power Distribution System for Josephson Tunnelling Logic Networks" by W. Anacker, appearing in the IBM TDB, Volume 16, Number 10, March 1974, pages 3398–99. On the other hand, the prior art has also proposed the use of special resetting signals and apparatus to effect a similar function, see for example, "Resetting Scheme for Josephson Tunnelling Combinatorial Logic Network" by W. Anacker appearing in the IBM Technical Disclosure Bulletin, Volume 16, Number 10, March 1974, pages 3400–01.

Desirably, of course, the device is arranged in a circuit so that no special resetting pulse signal is required for the reason that the necessity for such signals merely delays useful outputs from the Josephson device, and in effect detracts from the reason why the device is being used, i.e., its speed.

It is therefore an object of the present invention to provide a circuit including Josephson devices which is self-resetting in the presence of a typical pulse input. It is another object of the present invention to provide a circuit including at least one Josephson device, which, when subjected to a pulse input, produces a short output pulse on one transition of the input, and produces no discernible output on the remaining transition which circuit, however, does respond to the complementary transition of the input to reset itself so that on the next one transition of the input, a further output pulse is produced. It is a further object of the present invention to provide a circuit including Josephson devices which, in one embodiment, responds to a positive going transition of an input signal and which, in another embodiment, responds to a negative going transition on the input.

These and other objects of the invention are met by the apparatus of the present invention as will be made clear in the following description.

SUMMARY OF THE INVENTION

In accordance with the invention, a self-resetting circuit is provided including a plurality of Josephson devices, which can respond to a selected transition of a square wave input by providing relatively short pulse output, and which, although it resets itself in response to the complementary square wave transition, does not produce a discernible output responsive thereto. In one embodiment of the invention, the output is produced on the high going transition of the square wave input, while in another embodiment of the invention, the output is produced in the low going transition of the square wave input.

The circuit includes a first Josephson device coupled to a dc source of predetermined level; a control conductor associated with the first device is connected to the circuit input. The first Josephson device is arranged to switch to the voltage state in response to the high going transition of the square wave input. A current sinking circuit is connected in parallel with the first Josephson device, the sinking circuit includes a second Josephson device and an inductor. The second Josephson device includes one control conductor coupled to the control conductor of the first Josephson device and which, therefore, carries the same square wave circuit input as does the first Josephson device control conductor. The second Josephson device further includes a second control conductor which is arranged to carry dc of polarity opposite to the circuit input and of amplitude substantially equal to the square wave amplitude such that, in the presence of the circuit input the second Josephson device is subjected to a net zero magnetic field by reason of its control conductors. Accordingly, when the first Josephson device switches to the voltage stage, current begins flowing through the sinking circuit and increases at a constant rate.

In addition to the foregoing apparatus an output circuit is provided which includes a third Josephson device, a second inductor (which is much smaller than the inductor in the sinking circuit) and a resistance, all connected in series, one terminal of the output circuit is coupled to the dc source driving the circuit. In one embodiment of the invention, in which an output pulse is produced in response to the high going transition of the circuit input, the other terminal of the series output circuit is connected so that the output circuit, first Josephson device and sinking circuit are all connected in parallel.

In a second embodiment of the invention, the output circuit also has one terminal connected to the dc source, but the other terminal of the output circuit is connected between the second Josephson device and the inductor in the current sinking circuit.

In the first embodiment, when the first Josephson device switches to the voltage state, current flows in both the current sinking circuit and the output circuit, however, by reason of the ratio of the inductors in the output circuit and the current sinking circuit, the current increases in the output circuit at a higher rate. The third Josephson device is arranged, however, with a maximum current level which is less than the current that can be driven through it by the dc source. Accordingly, as the current rises steeply in the output circuit, the maximum current level of third Josephson device is exceeded, and it switches to the voltage state. At this point in time, the current in the output circuit decreases rapidly. Thus, the current in the output circuit is a short pulse substantially occurring at the positive going transition of the circuit input. The current in the current sinking circuit continues to increase in a linear fashion until such time as the current through the first Josephson device is reduced to zero. At this point, the first Josephson device switches to the zero voltage state, and at this point, the current in the current sinking circuit ceases to increase, but remains at a constant level. At about the same time, the third Josephson device also switches to the zero voltage state. At the negative going transition of the circuit input the second Josephson device is in a condition wherein the current through it exceeds the threshold which has now been reduced because of the net magnetic field to which the device is subjected. Accordingly, the second Josephson device now switches to the voltage state and the current through it begins to decrease to zero; the current is transferred to the first device. When the current through the second device is reduced to zero it also switches to the zero voltage state. At this point in time, the circuit is now reset and on the next positive going transition of the circuit input, the described operation is repeated.

The second embodiment operates in a very similar fashion. Assume that the dc current is flowing entirely through the first Josephson device which is in the zero voltage state as are the other two Josephson devices. On the positive transition of the circuit input, the first Josephson device switches to the voltage state and current is thus allowed to flow in the current sinking circuit. Current does not flow in the output circuit because it is coupled across the second Josephson device which is in the zero voltage state; current flow is also opposed by resistor R. Some time after the current is transferred to the current sinking circuit, the first Josephson device switches back to the zero voltage state. At the low going transition of the circuit input, the current flowing through the second Josephson device exceeds the current threshold, which is reduced when the circuit input low going transition occurs, and therefore, the second Josephson device switches to the voltage state. The current flowing through the inductor cannot change instantaneously and thus, current begins flowing in the output circuit. As the current flowing in the output circuit exceeds the threshold of the third Josephson device, connected serially therein, the third Josephson device switches to the voltage state and thus the current through the output circuit drops rapidly. The resulting output is a sharp pulse occurring at the low going transition of the circuit input. Inasmuch as the first Josephson device is now in the zero voltage state, current flows therethrough and the second and third Josephson devices are reset to their zero voltage state. On the high going transition circuit input, the first Josephson device is again switched to the voltage state, and the operation is repeated.

BRIEF DESCRIPTION OF THE DRAWINGS

Preferred embodiments of the invention will now be described with reference to the attached drawings in which like reference characters refer to identical apparatus, and in which.

DETAILED DESCRIPTION OF PREFERRED EMBODIMENTS

Figure 1:
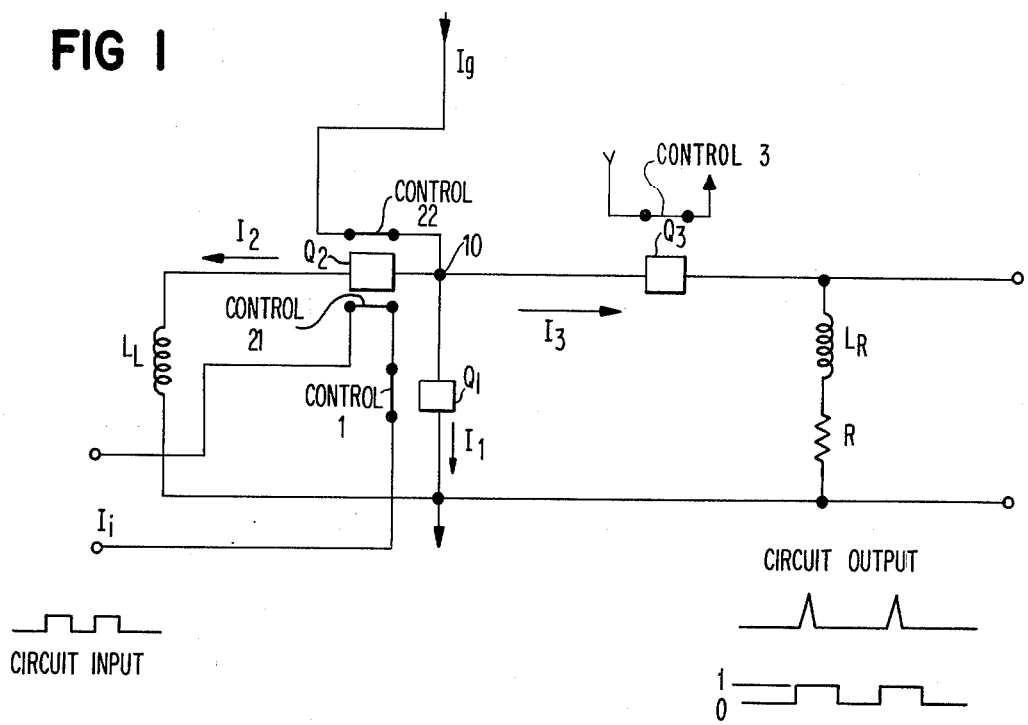
FIG. 1 is a schematic circuit diagram of one preferred embodiment.

FIG. 1 is a circuit diagram of one preferred embodiment of the invention. As illustrated, the circuit includes three Josephson junction devices, Q1, Q2 and Q3. Direct current $I_g$ flows to a junction point 10 which is connected to each of the Josephson devices Q1-Q3. The other terminal of Josephson device Q1 is connected to a current sink. A current sinking circuit is connected across Q1 and includes Q2 as well as an inductor $L_L$. An output circuit is also connected across Q1 and includes Q3 as well as an inductor $L_R$ and a resistance R. The circuit output is taken across the inductance $L_R$ and R. A circuit input is connected to one terminal of a control conductor CONTROL 1 for Q1. Serially connected to this control conductor is a control conductor CONTROL 21 for Q2. The direct current $I_g$ flows into the terminal 10 from another control conductor CONTROL 22 for Q2. Q2 is a form of Josephson device known to the art having the form of a split field interferometer or SQUID (acronym for Superconductive Quantum Interference Device). Such a device is disclosed, for example, in U.S. Pat. No. 3,978,351. The net magnetic field to which the Josephson device Q2 is subjected is the result of magnetic fields produced by the currents flowing in both the control conductors 21 and 22. Although not necessary to the invention, Q1 and Q3 could likewise be SQUIDs. The resistance R can represent the characteristic impedance of a terminated line, and $L_R$ is much smaller (at least one order of magnitude) than $L_L$. Furthermore, the current $I_g$ should be less than the threshold current $I_{mo}$ of Q1 and Q2, but greater than the threshold current of Q3. To describe how the circuit operates, assume that all Josephson devices are in the zero voltage state and $I_1 = I_g$, i.e., all the current is flowing through Q1. Assume further, that at this point in time, the circuit input exhibits a positive transition and the amplitude of the positive transition is such that $I_1$ is greater than the threshold current of Q1 with current flowing in its control conductor by reason of the circuit input waveform. At this time, Q1 switches to the voltage state and substantially all the current is switched to the sinking and output circuits. However, because $L_L >> L_R$ most of the current initially flows through the output circuit. Since $I_g$ is greater than the threshold current of Q3, it too switches to the voltage state when the current $I_3$ exceeds $I_{mo}$. Accordingly, $I_3$ rapidly is reduced. $I_g$ flows into the current sinking circuit. The current in the current sinking circuit increases at a constant rate because of the presence of $L_L$. Because the net magnetic field to which Q2 is subjected is essentially zero, since $I_g$ is about the same as the current flowing in the control conductor, but of opposite polarity, all the current switches to the current sinking circuit, and both Q1 and Q3 switch back to the zero voltage state. With Q1 in the zero voltage state current in the sinking circuit is stabilized. When the negative going transition of the input occurs, the net magnetic field to which Q2 is subjected changes drastically, inasmuch as there is now no magnetic field opposing the magnetic field produced by $I_g$. Correspondingly, the effective threshold of Q2 is substantially reduced, and because of the current carried by Q2, it now switches to the voltage state. Accordingly, current begins flowing now in Q1 and the current distribution gradually changes until all the current, $I_g$, flows through Q1, at which point Q2 switches back to the zero voltage state. At this point, the circuit has completed one complete cycle of operation and is prepared to accept another positive going transition of the circuit input.

Suitable values for the circuit of FIG. 1 to produce an output pulse on the order of 50 pico-seconds include the following parameters:

$L_L = 300$ pH; $L_R = 15$ pH; $R = 1$ ohm.

Q1 and Q2 are 1-2-1 split field interferometers (such as those disclosed in U.S. Pat. No. 3,978,351) with $LI_O/\phi_O = 0.21$, (where $\phi_O$ is a single flux quantum); $I_{mo} = 2.28$ mA; $R_j = 7$ ohms; $C_j = 7.4$ pF. Q3 may be a single junction with $I_{mo} = 1.14$ mA; $R_j = 14$ ohms and $C_j = 3.7$ pF. $I_g = 1.5$ mA and the circuit input has a 950 pico-second period with a transition from 0 mA to 1.5 mA.

Numerous changes can be made to the circuit illustrated in FIG. 1. For example, the control current 22 for Q2 need not actually comprise $I_g$, but can be supplied from another source, which source may have its current amplitude selected in accordance with the desired functioning of Q2 in the circuit. Furthermore, while Q3 has been disclosed as a single junction, it may also be a split field interferometer and the control currents to which the device is subjected may be selected in accordance with the desired operation.

Figure 2A:
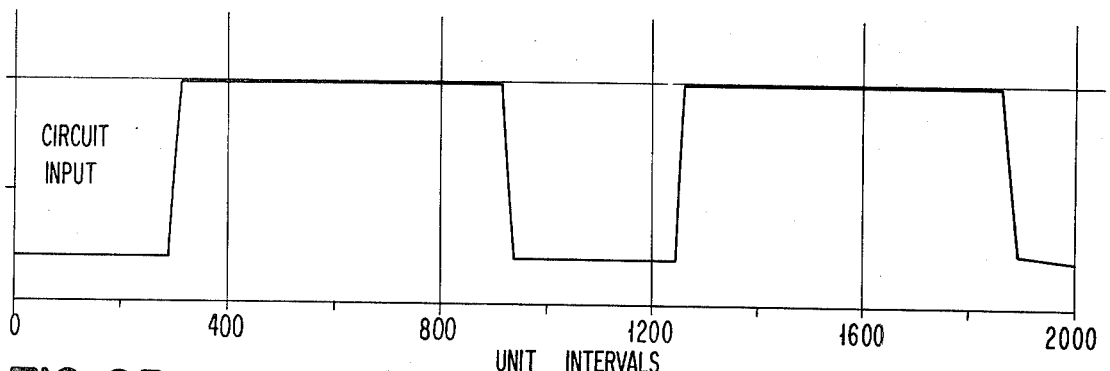
FIGS. 2A-2H are waveforms produced in simulating the circuit of FIG. 1.
Figure 2B:
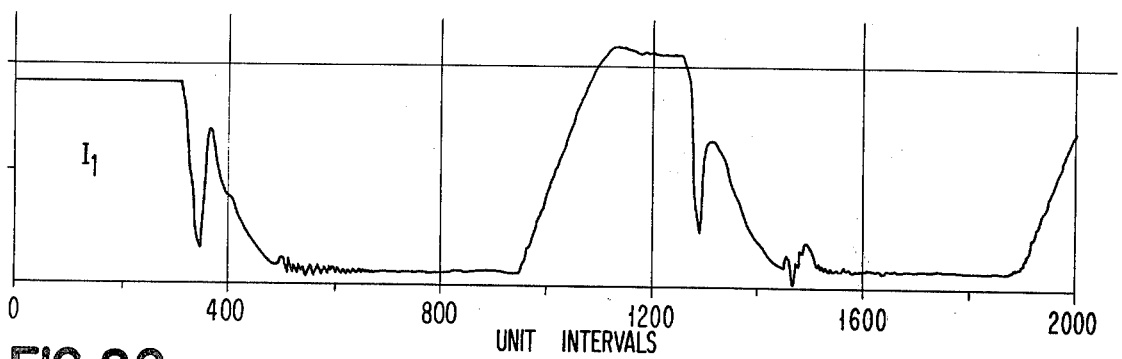
Figure 2C:
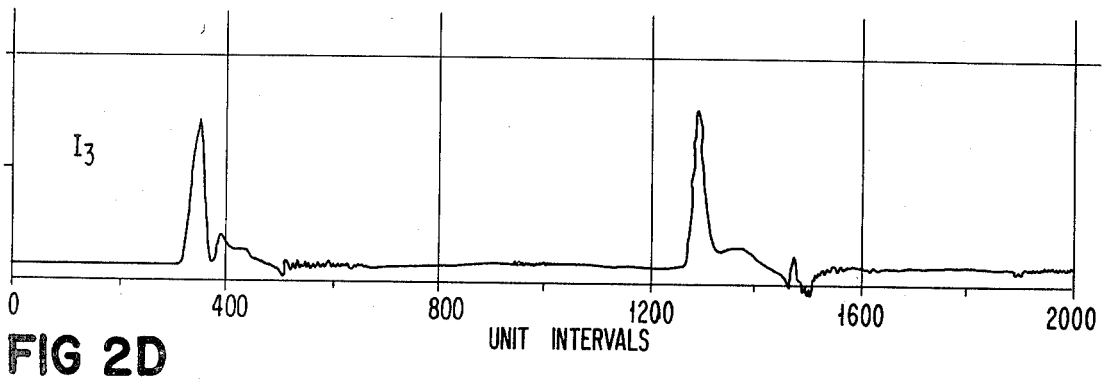
Figure 2D:
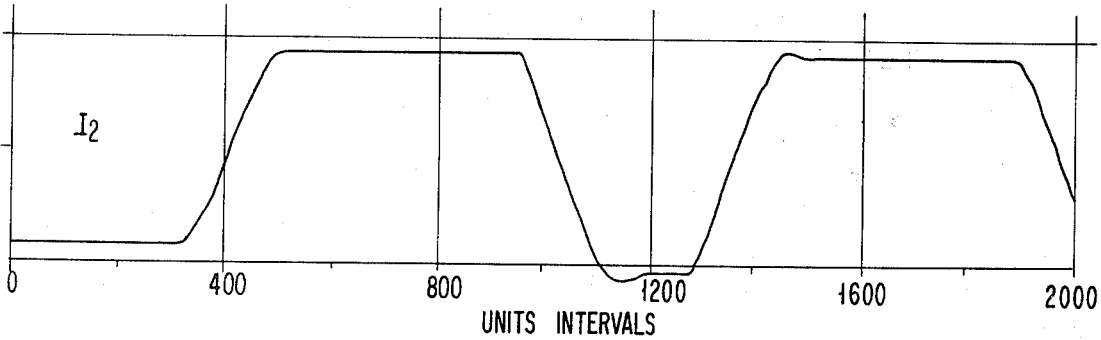
Figure 2E:
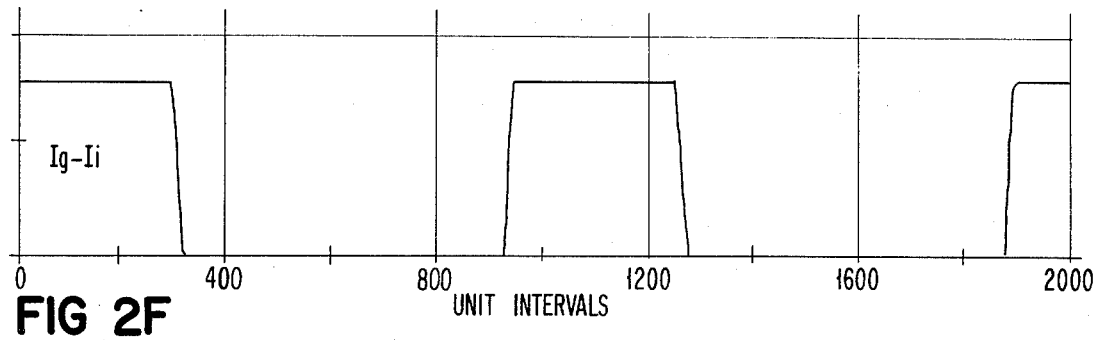
Figure 2F:
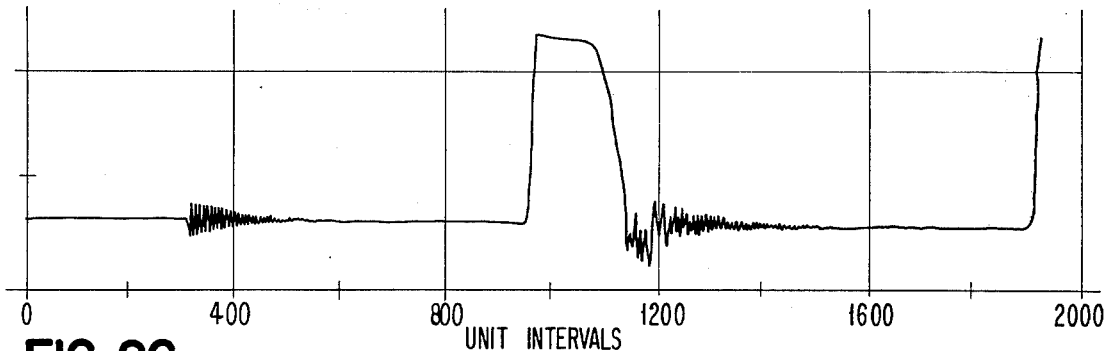
Figure 2G:
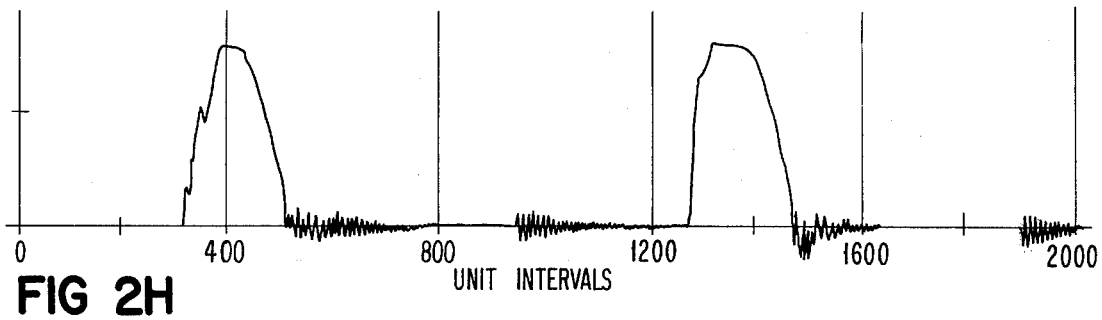
Figure 2H:
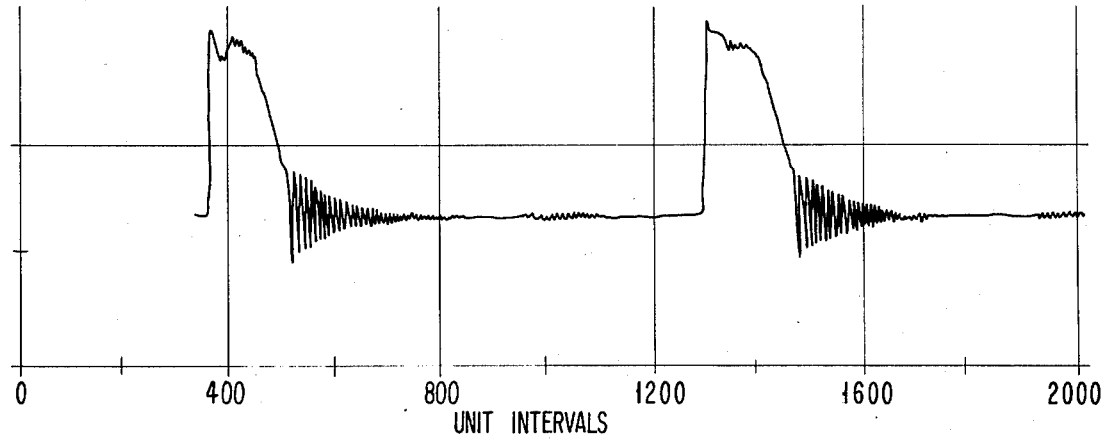

In simulating operations of the above-described circuit, the circuit input employed a waveform such as that shown in FIG. 2A. Correspondingly, the current through Q1 is shown in FIG. 2B, the current through Q3 is shown in FIG. 2C, the current in Q2 is shown in FIG. 2D and FIG. 2E illustrates the magnetic field to which Q2 is subjected, being the difference between $I_g$ and the circuit input waveform (FIG. 2A). The voltage across Q1, Q2 and Q3 is shown respectively in FIGS. 2F, 2G and 2H. The waveform of FIG. 2C, that is, the current through Q3, is also an indication of the output voltage available across $L_R$ and the resistance.

The circuit of FIG. 1 provides a short output pulse on each positive transition of an input square waveform. It is sometimes desirable to be able to produce a short output pulse on the negative going transition of a square wave input waveform. The circuit of FIG. 1 can be employed to perform such a function with a slight modification as shown, for example, in FIG. 3.

Figure 3:
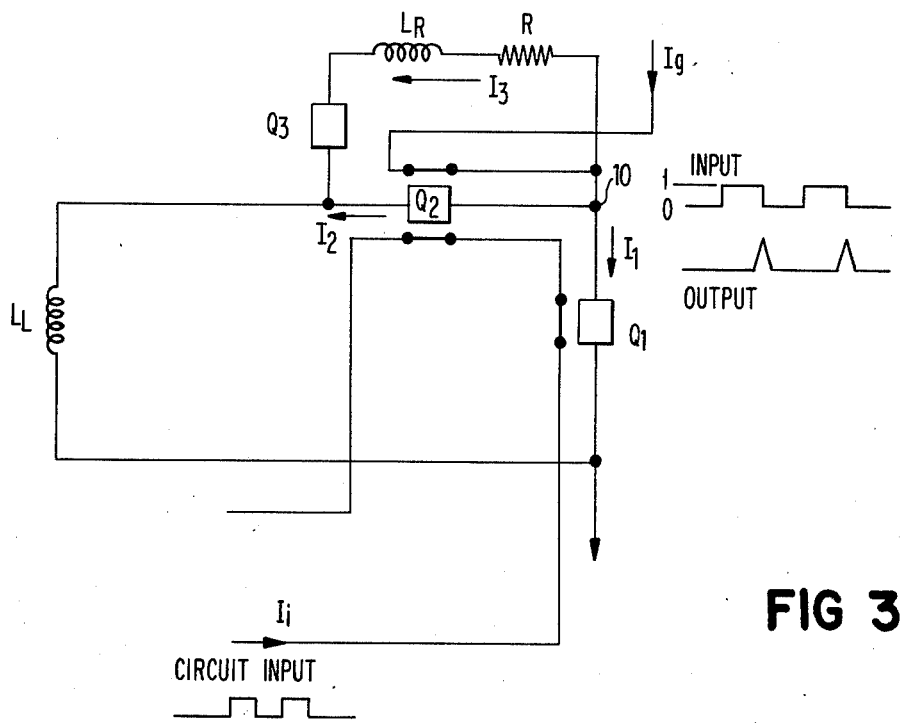
FIG. 3 is a schematic circuit diagram of another embodiment of the invention.

As shown in FIG. 3, the Josephson device Q1 has applied to it a direct gate current $I_g$. A sinking circuit is connected across Q1 which sinking circuit is, as in FIG. 1, comprised of a second Josephson device Q2 and an inductor $L_L$. The same output circuit comprising Josephson device Q3, inductor $L_R$ and a resistance R has one terminal connected to the circuit point 10, as in FIG. 1. However, in contrast to FIG. 1, the output circuit is now connected across the Josephson device Q2, rather than being connected across the Josephson device Q1. If desired, the same parameters discussed above with regard to FIG. 1 can be employed in the circuit of FIG. 3. In operation, we can assume that the gate current is flowing entirely through Q1 when the circuit input is zero. On the positive going transition of the circuit input, Q1 is switched to the voltage state because the gate current $I_g$ is now above the threshold which is reduced by the circuit input pulse. At the same time, however, the circuit input $I_i$ opposes the magnetic field of $I_g$ in the Josephson device Q2 and thus current can be switched into the current sinking path; since the current sinking circuit includes the inductor $L_L$, the current will be gradually shifted from Q1 to Q2. No current will flow in the output circuit so long as Josephson device Q2 is in the zero voltage state, since there is essentially no driving voltage to force current through this circuit. Thus, assuming the circuit input pulse is long enough, substantially the entire gate current $I_g$ flows in the current sinking circuit, no current will be flowing through Josephson device Q1, and it will therefore switch back to the zero voltage state. At the negative going transition of the circuit input, however, Josephson device Q2 switches to the voltage state. This occurs, inasmuch as the net magnetic field to which Q2 is subjected rapidly changes as $I_i$ goes to 0 and thus Q2 finds itself in the voltage state. Inasmuch as the current through inductor $L_L$ cannot change instantaneously the current that was previously flowing through Q2 is now switched into the output circuit path very rapidly. As this current rises, however, it will exceed the current threshold of Q3 which also switches to the voltage state. Accordingly, the current through the output circuit drops rapidly, as does the current through the current sinking circuit and the current is steered, instead, through Q1, which is now in the zero voltage state. When current has ceased flowing through Q2 and Q3, both these switch back to the zero voltage state. This terminates the output pulse in the series output circuit, and also completes the cycle of operation. The output, available across $L_R$ and R is a short pulse at the negative transition of the input. The positive transition produces no discernible output although it does have the effect of resetting the circuit so that it can respond to another negative transition.

The circuits of FIGS. 1 and 3 are complementary in that the circuit of FIG. 1 produces an output pulse on one transition of an input square waveform, whereas the circuit of FIG. 3 produces an output pulse on the other transition. Both circuits can be viewed as including a first current conducting circuit with a Josephson device normally carrying current and responsive to a first transition in the circuit input for switching to a voltage state to thereby impede current flow therethrough, an output circuit connected in parallel with the Josephson device and including a second Josephson device therein for producing an output pulse with a leading edge formed as current switches into the output circuit and a trailing edge as the current through the second Josephson device exceeds its threshold and it switches to a voltage state to thereby steer current out of said output circuit, and a resetting circuit means which responds to the complementary transition in the input waveform to switch current back to the first current conducting circuit. In FIG. 1, the first Josephson device is Q1, the output circuit includes Q3 and the resetting circuit includes Q2. In the circuit of FIG. 3 on the other hand, the first current conducting circuit comprises Q2, the output circuit again comprises Q3 and the resetting circuit comprises Q1.

Many changes can be made to the inventive circuits within the scope of the invention. For example, the circuit operation can be made selective by arranging Q3 to have a threshold $I_{Mo}$ exceeding $I_g$ and associating a control conductor therewith. Accordingly, in the absence of control current in the conductor, the output produces broad, rather than short pulses. In the presence of current in the third Josephson device's control conductor, reducing $I_{Mo}$ below $I_g$, the short pulses will be produced. The amplitude and duration of such pulses can be altered by means of the control current associated with Q3.

What is claimed is:

1. A self-resetting Josephson circuit for responding to one transition in a substantially square wave type waveform by producing an output pulse and for responding to a complementary transition in said square wave type waveform to reset itself to thereby provide a self-resetting circuit comprising:
    a source of direct current;
    a first current conducting circuit connected to said source and includng a first Josephson device therein, said first current conducting circuit responsive to said one transition in said square wave type waveform for switching to a voltage state to thereby impede current flow therethrough;
    an output circuit connected in parallel to said first Josephson device, said output circuit including a second Josephson device and impedance means serially connected thereto, for producing an output pulse with a leading edge as current switches into said output circuit and a trailing edge as said second Josephson device switches to a voltage state in response to current therethrough exceeding a current threshold of said second Josephson device; and
    resetting circuit means also connected to said dc source and including a third Josephson device therein and responsive to a complementary transition of said square wave type waveform for switching to a voltage state to thereby steer current back into said first Josephson device.

2. The apparatus of claim 1 in which said first Josephson device includes means responsive to said one transition of said squarewave type waveform to reduce the current threshold of said device whereby said Josephson device switches from a zero voltage state to a voltage state in response to said one transition.

3. The apparatus of claim 1 wherein said third Josephson device includes means responsive to said complementary transition of said squarewave type waveform to decrease a current threshold of said Josephson device to thereby switch said device from a zero voltage state to a voltage state in response to said complementary transition.

4. The apparatus of claim 1 wherein said first and third Josephson devices comprise interferometric Josephson devices.

5. The apparatus of claim 1 wherein said first transition of said squarewave type waveform comprises a rising edge and said complementary transition comprises a falling edge, said dc source providing a current level exceeding a current threshold of said second Josephson device and less than an undisturbed current threshold of said first and third Josephson devices.

6. The apparatus of claim 1 wherein said first transition of said squarewave type waveform comprises a falling edge and said complementary transition comprises a rising edge, said dc source providing a current level exceeding a current threshold of said second Josephson device and less than an undisturbed current threshold of said first and third Josephson devices.

7. The apparatus of claim 1 in which said first and third Josephson devices each include a control conductor coupled to said square type waveform.

8. The apparatus of claim 7 in which said first Josephson device includes a further conductor coupled to a dc source of amplitude and polarity to oppose a magnetic field produced by said control conductor.

9. The apparatus of claim 7 in which said third Josephson device includes a further conductor coupled to a dc source of amplitude and polarity to oppose a magnetic field produced by said control conductor.

10. The apparatus of claim 9 wherein said source of dc and said dc source are one dc source.

11. A Josephson device circuit comprising:
    a first Josephson device adapted to be coupled between dc source and sink, said first device including a control conductor for subjecting said device to a magnetic field related to current carried by said control conductor to thereby reduce a threshold of said device,
    a second Josephson device and serially connected inductor connected across said first device, said second device including a control conductor serially connected to said control conductor of said first device, a second control conductor and a current source for said second control conductor of amplitude A,
    a third Josephson device and serially connected impedance means coupled across said first device, said impedance means including inductance less than inductance of said inductor,
    whereby a square wave input applied to control conductors of said first and second devices of pulse amplitude A and polarity to cancel a magnetic field produced at said second control conductor of said second device results in short positive pulse outputs across said impedance means at positive transitions of said square wave.

12. The device of claim 11 in which said third Josephson device includes a third control conductor selectively carrying a dc current whereby said short pulse outputs are produced when said third control conductor carries said dc current.

13. A Josephson device circuit comprising:

a first Josephson device adapted to be coupled between dc source and sink, said first device including a control conductor for subjecting said device to a magnetic field related to current carried by said control conductor to thereby reduce a threshold of said device, a second Josephson device and serially connected inductor connected across said first device, said second device including a control conductor serially connected to said control conductor of said first device, a second control conductor and a current source for said second control conductor of amplitude A, a third Josephson device and serially connected impedance means coupled across said second device, said impedance means including inductance less than inductance of said inductor, whereby a square wave input applied to control conductors of said first and second devices of pulse amplitude A and polarity to cancel a magnetic field produced at said second control conductor of said second device results in short positive pulse outputs across said impedance means at negative transitions of said square wave.

14. The device of claim 13 in which said third Josephson device includes a third control conductor selectively carrying dc current whereby said short pulse outputs are produced when said third control conductor carries said dc current.

15. A circuit for resetting a latching Josephson junction comprising:

a switchable Josephson junction which remains in the voltage state until current through it is reduced to zero shunted by a resistance and an inductance disposed in series with said resistance having a given value of inductance, a resetting circuit shunting said Josephson junction which includes another Josephson junction and an inductance having a value of inductance greater than said given value of inductance arranged in series in said resetting circuit, means for supplying a gate current to said switchable Josephson junction which includes a current carrying conductor a portion of which is disposed in electromagnetically coupled relation with said another junction to bias it in a non-conductive state, and means disposed in electromagnetically coupled relationship with said junctions for simultaneously delivering an output signal to said resistance and actuating said resetting circuit by rendering said another junction conductive.

16. A circuit for resetting according to claim 15 further including means disposed in series with said resistance for providing a return to zero pulsed output across said resistance only when said gate current undergoes an excursion from one current to a higher current level.

* * * * *

UNITED STATES PATENT AND TRADEMARK OFFICE
CERTIFICATE OF CORRECTION

PATENT NO. : 4,144,465
DATED : March 13, 1979
INVENTOR(S) : Faris, Sadeg M.

It is certified that error appears in the above-identified patent and that said Letters Patent are hereby corrected as shown below:

In column 7, line 29, change "Ig" to --$I_g$--.

Signed and Sealed this

Twenty-seventh Day of November 1979

[SEAL]

Attest:

RUTH C. MASON
*Attesting Officer*

LUTRELLE F. PARKER
*Acting Commissioner of Patents and Trademarks*